United States Patent
Pribbernow et al.

(10) Patent No.: US 8,365,049 B2
(45) Date of Patent: Jan. 29, 2013

(54) SOFT-ERROR DETECTION FOR ELECTRONIC-CIRCUIT REGISTERS

(75) Inventors: Claus Pribbernow, München (DE); Stephan Habel, Berg (DE)

(73) Assignee: LSI Corporation, Milpitas, CA (US)

( * ) Notice: Subject to any disclaimer, the term of this patent is extended or adjusted under 35 U.S.C. 154(b) by 927 days.

(21) Appl. No.: 12/335,096

(22) Filed: Dec. 15, 2008

(65) Prior Publication Data
US 2010/0153824 A1    Jun. 17, 2010

(51) Int. Cl.
*H03M 13/00* (2006.01)
(52) U.S. Cl. .......................................................... 714/780
(58) Field of Classification Search ................... 714/780
See application file for complete search history.

(56) References Cited

U.S. PATENT DOCUMENTS

| | | | |
|---|---|---|---|
| 3,786,282 A | 1/1974 | Orndorff | 307/291 |
| 4,201,337 A | 5/1980 | Lewis et al. | 371/37 |
| 6,624,677 B1 | 9/2003 | Wissel | 327/202 |
| 7,428,694 B2 * | 9/2008 | Pistoulet | 714/820 |
| 7,546,519 B2 * | 6/2009 | Agarwal | 714/823 |
| 7,551,470 B2 * | 6/2009 | Erickson et al. | 365/96 |
| 7,747,936 B2 * | 6/2010 | Pistoulet | 714/820 |
| 2003/0229824 A1 * | 12/2003 | Waller | 714/30 |
| 2008/0094896 A1 * | 4/2008 | Erickson et al. | 365/185.09 |
| 2008/0120525 A1 * | 5/2008 | Agarwal | 714/731 |
| 2012/0212271 A1 * | 8/2012 | Dally et al. | 327/199 |

* cited by examiner

*Primary Examiner* — Amine Riad
(74) *Attorney, Agent, or Firm* — Mendelsohn, Drucker & Associates, P.C.; Edward J. Meisarosh; Steve Mendelsohn

(57) ABSTRACT

In one embodiment, a circuit has multiple flip-flops with gated clock inputs controlled by an enable signal, where the clock signal is gated in order to reduce power consumption by the circuit. The circuit has an error detection and correction (EDC) module that is active when the enable signal is low in order to detect and correct soft errors of the flip-flops. The EDC module generates and stores an error-correction code based on the data outputs of the flip-flops. The EDC module then compares the stored error-correction code to a presently generated error-correction code, where if they are not identical, then the EDC (a) determines (i) that a soft error has occurred and (ii) which flip-flop suffered the soft error and (b) flips a corresponding error-correction signal to provide a correct corresponding output signal while the enable signal is low.

21 Claims, 6 Drawing Sheets

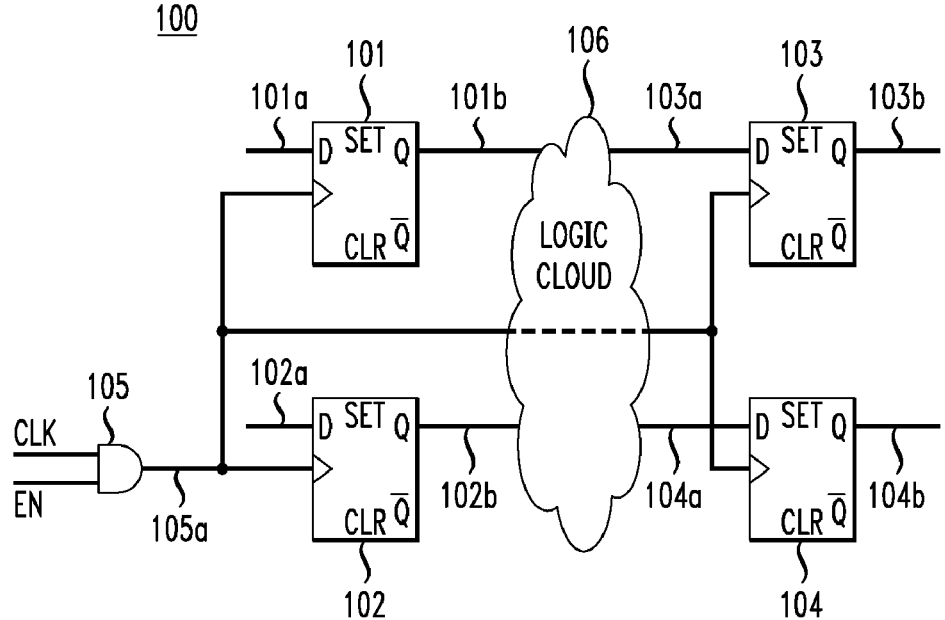

300

700

SOFT-ERROR DETECTION FOR ELECTRONIC-CIRCUIT REGISTERS

BACKGROUND OF THE INVENTION

1. Field of the Invention

The present invention relates to electronic-circuit registers, and in particular, to the detection of soft errors in electronic-circuit registers.

2. Description of the Related Art

Some electronic circuits include registers. An electronic-circuit register typically includes one or more latches. A latch, as used herein, refers to a bi-stable electronic logic circuit, i.e., a logic circuit having two stable states, where the circuit can be used to store one bit of data. As is known in the art, multiple types of latches are possible, e.g., SR latches, D latches, and flip-flops. A flip-flop, as used herein, refers to a clocked latch, i.e., a latch circuit that updates its output at times indicated by an enabling clock signal. As is known in the art, multiple types of flip-flops are possible, e.g., JK flip-flops and D flip-flops. Some flip-flops are edge-triggered, updating their outputs on the uptick, i.e., rising edge, or downtick, i.e., falling edge, of the clock signal. Other flip-flops are level-enabled, updating their outputs for the duration that the clock signal is high or for the duration that the clock signal is low.

Registers are different from memory arrays. Similarly, flip-flops are different from the memory cells that make up memory arrays. In particular, flip-flops are different from non-volatile memory cells, such as read-only memory (ROM) cells, because flip-flops, unlike non-volatile memory cells, do not retain their stored values once they are powered down. Flip-flops are different from volatile memory cells, such as random-access memory (RAM) cells, in several ways. Flip-flops are different from dynamic RAM (DRAM) memory cells which need to be regularly refreshed, typically many times a second, to maintain their data, since flip-flops do not require such regular refreshing. RAM memory cells, both DRAM and static RAM (SRAM), are organized in memory arrays, where each RAM memory cell stores one bit of an addressable byte or word, while flip-flops are freestanding devices. To find out the value stored by a RAM memory cell, specialized read circuitry has to read the value of the byte or word that comprises that memory cell. The memory-reading process involves providing power on selected bit and word lines for conditional transmission to the read circuitry, where transmission is based on the values stored by the memory cells being read. A flip-flop, however, outputs its stored value without requiring specialized reading circuitry. Thus, a flip-flop, whenever it is powered up, outputs a signal that can drive another device, while a memory cell does not. Therefore, flip-flops tend to have faster access times than comparable-technology memory cells.

FIG. 1 shows circuit 100 comprising four rising-edge-triggered D flip-flops 101, 102, 103, and 104 having (i) signals 101a, 102a, 103a, and 104a, respectively, as D inputs and (ii) signal 105a as clock inputs. Circuit 100 further comprises AND gate 105, which serves to gate clock signal CLK. AND gate 105 has clock signal CLK and enable signal EN as inputs and signal 105a as an output. If enable signal EN is low, then signal 105a is low regardless of the state of clock signal CLK. If, however, enable signal EN is high, then signal 105a follows clock signal CLK. The data outputs of flip-flops are generally referred to herein as Q and $\overline{Q}$ outputs. The Q outputs of flips-flops 101 and 102, i.e., signals 101b and 102b, respectively, go into logic cloud 106, which contains zero or more logical circuits. Signals 103a and 104a, each of which depends in some way on one or both of signals 101b and 102b, are provided as D inputs to flip-flops 103 and 104, respectively, from logic cloud 106. Flip-flops 103 and 104 output signals 103b and 104b, respectively. Flip-flops 101, 102, 103, and 104 pass signals applied to their D inputs to their Q outputs (and inverted versions of these signals to their $\overline{Q}$ outputs) on rising edges of gated clock signal 105a.

A flip-flop uses additional power whenever its clock input causes a data refresh. If the values stored in a flip-flop register remain substantially constant, then power usage can be reduced by conditionally gating (e.g., holding constant) the clock signal input to the register's flip-flops. For example, in circuit 100 of FIG. 1, signal 105a, applied to the clock inputs of the flip-flops, can be held constant by de-asserting (i.e., setting to low) enable signal EN. If the clock input is periodically held constant, then the flip-flops refresh less frequently and, consequently, use less power overall. If the flip-flops of circuit 100 do not need to be constantly refreshed, then this provides an opportunity to save energy on the operation of circuit 100. Thus, circuit 100 can use gate 105 to gate clock signal CLK in order to reduce the energy used by circuit 100.

Flip-flops such as those in circuit 100 are subject to soft errors, where transient conditions cause the stored bit's value to flip. One common cause of soft errors is cosmic radiation, where a cosmic ray strikes a flip-flop and creates a transient condition that provides sufficient energy to flip the stored bit. If a soft error occurs in a circuit whose clock signal is gated to save energy, then that error can remain for a relatively long time, thereby causing long-term and undetected provision of erroneous information within circuit 100.

One known method to mitigate the soft-error problem is to implement a hardened flip-flop, i.e., a flip-flop that is less likely than an un-hardened flip-flop to be affected by transient conditions and suffer a soft error. U.S. Pat. No. 3,786,282 to Orndorff, incorporated herein by reference in its entirety, describes a flip-flop hardened against soft errors by using "a capacitive memory in the cross coupled feedback loop of the flip flop circuit to drive the flip flop back to its pre-irradiation state" (Orndorff, Abstract).

U.S. Pat. No. 6,624,677 to Wissel, incorporated herein by reference in its entirety, describes a different scheme for a hardened flip-flop that comprises "a master latch circuit; a slave latch circuit coupled to the master latch circuit; and a correction circuit for increasing an amount of charge that can be absorbed by the master latch circuit in response to a soft-error event when the slave latch circuit is in a transparent phase and when both the master and slave latch circuits are storing the same data" (Wissel, Abstract). An additional technique mentioned in the Wissel patent for reducing the sensitivity of flip-flop circuits to soft errors includes increasing the physical size of the flip-flops, which makes the flip-flops less susceptible to soft errors from the impact of cosmic rays. Schemes for hardening flip-flops require additional physical space on a circuit where space is likely at a premium. In addition, hardened flip-flops can still suffer soft errors.

Another technique for dealing with soft errors is the implementation of redundant registers. One duplicate register set can indicate an error where corresponding flip-flops, i.e., a base flip-flop and a corresponding duplicate flip-flop, output different values. Soft errors can be corrected by using majority voting among trios of corresponding flip-flops, i.e., a base flip-flop and two corresponding duplicate flip-flops. For example, if one flip-flop in a trio suffers a soft error, the trio will still output the correct value because the other two corresponding flip-flops will have the correct value. This correct value can also be used to correct the flip-flop which suffered the soft error. Redundant registers and their attendant circuitry, however, take up a lot of additional physical space on a circuit where space is likely at a premium.

SUMMARY OF THE INVENTION

One embodiment of the invention can be an integrated circuit (IC) comprising a first plurality of flip-flops and an error-detection module. Each flip-flop is adapted to (1) receive a corresponding data-input signal and a corresponding clock-input signal and (2) provide a corresponding data-output signal. The error-detection module is connected to receive the data-output signals of the first plurality of flip-flops. The error-detection module is adapted to (1) generate a first error-detection code based on a first set of values of the received data-output signals of the first plurality of flip-flops, and (2) process (i) the first error-detection code and (ii) a second set of values of the received data-output signals of the first plurality of flip-flops to generate an error-detection signal indicating whether or not the error-detection module detected a soft error of a flip-flop in the second set of values of the received data-output signals.

Another embodiment of the invention can be a method for detecting a soft error of a flip-flop in a first plurality of flip-flops in an integrated circuit (IC). The method comprises (1) receiving, by each flip-flop of the first plurality of flip-flops, a corresponding data-input signal and a corresponding clock-input signal, (2) providing, by each flip-flop of the first plurality of flip-flops, a corresponding data-output signal, (3) generating a first error-detection code based on a first set of values of the data-output signals of the first plurality of flip-flops, and (4) processing (i) the first error-detection code and (ii) a second set of values of the data-output signals of the first plurality of flip-flops to generate an error-detection signal indicating whether or not the soft error of the flip-flop was detected in the second set of values of the received data-output signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows a simplified block diagram of a prior-art circuit having four flip-flops.

FIG. 2 shows a simplified block diagram of a circuit, in accordance with one embodiment of the present invention, having an error-detection (ED) module.

DETAILED DESCRIPTION

Figure 3:
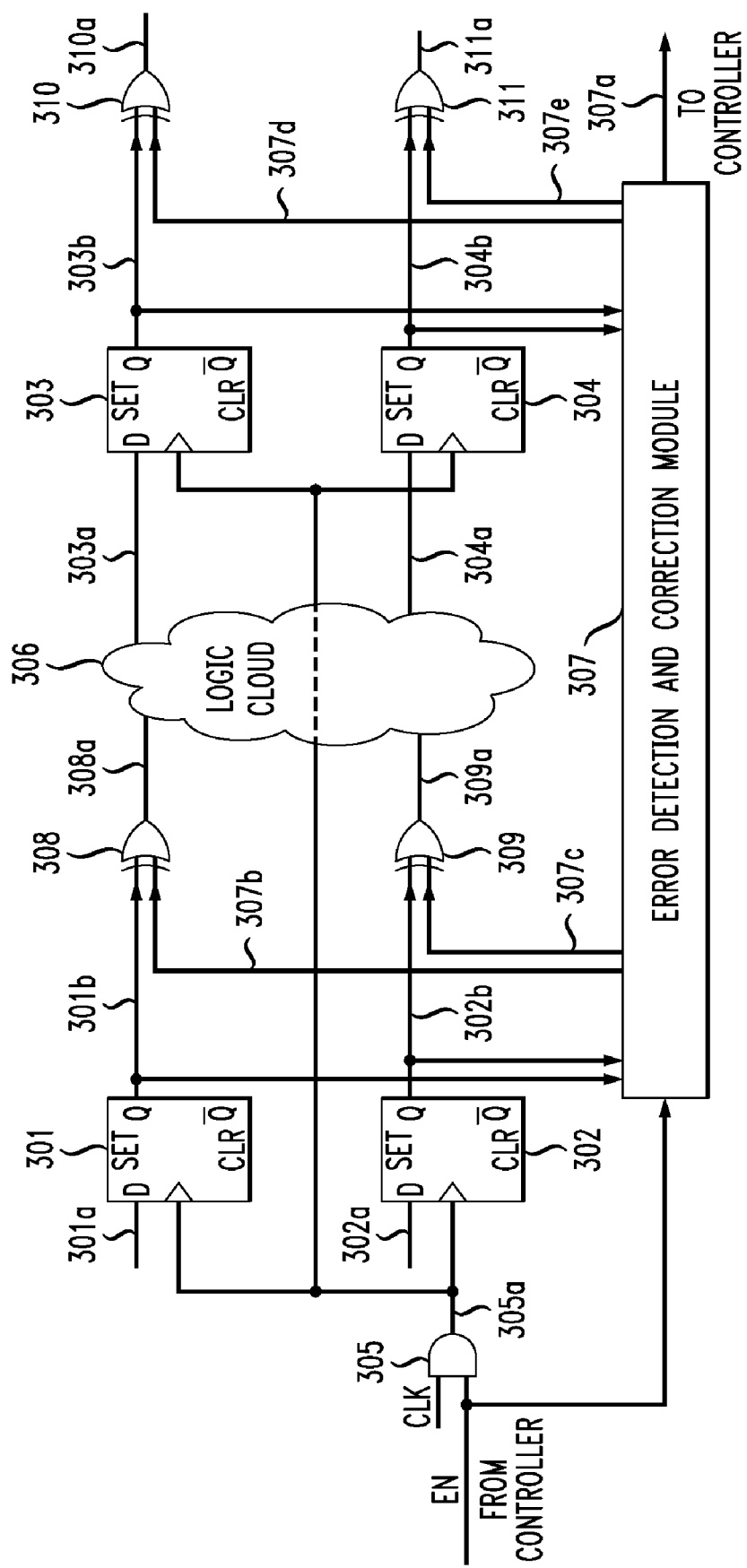
FIG. 3 shows a simplified block diagram of a circuit, in accordance with another embodiment of the present invention, having an error detection and correction (EDC) module.

Many integrated circuits include registers having multiple flip-flops. Some circuits consist of flip-flops that are infrequently refreshed. For example, certain serializer-deserializer (SERDES) devices utilize a large collection of flip-flops to configure the SERDES device on power-up, where the values held by those flip-flops are not changed while the device remains powered up. As noted above, circuits whose values remain substantially constant are good candidates for clock gating in order to reduce power usage. For battery-powered devices, such as typical mobile communication devices, power saving is important, and techniques that save power are particularly useful. Thus, a register-containing circuit that saves power by clock gating while minimizing the resultant increased impact of soft errors is useful, particularly for battery-powered mobile devices.

FIG. 2 shows a simplified block diagram of circuit 200. Elements in circuit 200 that are substantially similar to corresponding elements in circuit 100 of FIG. 1 are similarly labeled, but with a different prefix. Thus, D flip-flops 201, 202, 203, and 204; logic cloud 206; and AND gate 205 operate in substantially the same way as the corresponding components in circuit 100. Circuit 200 further comprises error-detection (ED) module 207. ED module 207 receives as inputs enable signal EN and the Q output signals of flip-flops 201, 202, 203, and 204, namely signals 201$b$, 202$b$, 203$b$, and 204$b$, respectively. In response, ED module 207 provides error-detection signal 207$a$ as an output indicating whether or not ED module 207 detected a soft error of a flip-flop in the values of signals 201$b$, 202$b$, 203$b$, and 204$b$.

Enable signal EN is provided by a circuit controller (not shown). Whenever enable signal EN is de-asserted (i.e., goes low), ED module 207 generates an error-detection code based on Q output signals 201$b$, 202$b$, 203$b$, and 204$b$. Thus, ED module 207 generates a first error-correction code based on a first set of values of the Q output signals. The error-detection code is then stored in a hardened flip-flop (not shown) in ED module 207. When enable signal EN is later re-asserted (i.e., goes high), a new error-detection code is generated from Q output signals 201$b$, 202$b$, 203$b$, and 204$b$. Thus, ED module 207 generates a second error-correction code based on a second set of values of the Q output signals. The new error-detection code is compared to the stored error-detection code. If the new error-detection code differs from the stored error-detection code, then ED module 207 determines that an error had occurred, and ED module 207 provides an error notification to the controller via output signal 207$a$. The controller then takes appropriate action in response to the error notification. As would be appreciated by one of ordinary skill in the art, this implementation provides rudimentary error-detection capabilities which are sufficient for applications where, for example, error-detection accuracy is not critical (since, if, for example, the error-detection code is a single parity bit, then it can only detect an odd number of errors) and where incorrect data can be relatively easily replaced with correct data. As would be further appreciated by one of ordinary skill in the art, in other implementations, ED module 207 can generate error-detection codes other than simple parity bits.

In one alternative implementation of ED module 207, the stored error-detection code is periodically compared, at predetermined intervals, to a current error-detection code while enable signal EN is low, so that a soft error occurring while enable signal EN is low can be detected shortly after occurring. Thus, ED module 207 repeatedly updates error-detection signal 207$a$ based on the stored error-detection code and a repeatedly updated set of values of signals 201$b$, 202$b$, 203$b$, and 204$b$. In another alternative implementation of ED module 207, the stored error-detection code is substantially constantly getting compared to a current error-detection code, so that an error can be detected substantially instantaneously.

This alternative implementation allows for an error-triggered refreshing of circuit 200, where an assertion of output signal 207a triggers the controller to re-assert enable signal EN.

In some implementations of ED module 207, as described above, the error-detection code is stored using one or more hardened flip-flops (not shown). In another implementation of ED module 207, the error-detection code is stored using regularly-refreshed flip-flops (not shown). In yet another implementation of ED module 207, the error-detection code is stored in RAM (not shown). In yet another implementation of ED module 207, the error-detection code is stored in non-volatile memory. The devices storing the error-detection code may be within ED module 207 or may be located elsewhere and accessed via a data bus (not shown).

FIG. 3 shows a simplified block diagram of circuit 300. Elements in circuit 300 that are substantially similar to corresponding elements in circuit 200 of FIG. 2 are similarly labeled, but with a different prefix. Circuit 300 further comprises exclusive-OR (XOR) gates 308, 309, 310, and 311, which act as error-correcting gate modules. Circuit 300 comprises error detection and correction (EDC) module 307, which corresponds to ED module 207 of circuit 200. Unlike ED module 207, which only detects register errors in circuit 200, EDC module 307 both detects and corrects register errors in circuit 300. Also unlike ED module 207, which stores an error-detection code, EDC module 307 instead stores an error-correction code, which may be stored in any of a variety of forms and locations, depending on implementation particulars, as noted above in reference to error-detection codes.

EDC module 307 receives as inputs (i) Q output signals 301b, 302b, 303b, and 304b from flip-flops 301, 302, 303, and 304, respectively and (ii) enable signal EN from the controller (not shown). EDC module 307 outputs (i) error-detection signal 307a and (ii) error-correction signals 307b, 307c, 307d, and 307e, which (a) are inputs to XOR gates 308, 309, 310, and 311, respectively, and (b) are used to compensate for soft errors in their corresponding flip-flops, as needed. The other inputs for XOR gates 308, 309, 310, and 311 are Q output signals 301b, 302b, 303b, and 304b, respectively.

When enable signal EN is de-asserted, EDC module 307 generates and stores an error-correction code (ECC), rather than the error-detection code of ED module 207. EDC module 307 then checks for errors while enable signal EN is low. The values stored by the flip-flops of circuit 300 should not change when enable signal EN is low since the clock inputs for those flip-flops are low when enable signal EN is low, which means that those flip-flops should not be updating their outputs during that interval. Thus, if EDC module 307 detects a change in the values of the Q outputs of the flip-flops of circuit 300, then EDC module 307 determines that an error has occurred. Depending on the particular error and the particular type of ECC algorithm used, EDC module 307 may be able to correct the error so that circuit 300 outputs correct values. EDC module 307 can correct a flipped signal by flipping the appropriate error-correction signal from EDC module 307 to the corresponding XOR gate.

When enable signal EN is high and, consequently, at the moment that enable signal EN is de-asserted, error-correction signals 307b, 307c, 307d, and 307e are all low (binary 0). This means that the respective XOR gates of the error-correction signals output whatever value is provided by each XOR gate's other input, i.e., the Q output of the flip-flop corresponding to that XOR gate. If any error-correction signal goes high, then the corresponding XOR gate would output the inverse of the Q output of the corresponding flip-flop.

For example, if, when enable signal EN is de-asserted, signals 301b and 303b are high (binary 1) and signals 302b and 304b are low, then XOR outputs 308a and 310a are high and signals 309a and 311a are low. Suppose that flip-flop 303 subsequently suffers a soft error, and Q output 303b goes from high to low. Consequently, XOR gate 310's output signal 310a would also go from high to low. However, EDC module 307 would detect the error and change error-correction signal 307d from low to high, which would bring output 310a from low back to high. Thus, when error-correction signal 307d is high, XOR gate 310 outputs the inverse of Q output 303b. This would keep the output signals of circuit 300 at their intended values, except for a brief transient. EDC module 307 would also provide an error-occurrence notification to the controller via error-detection signal 307a. In response, the controller can keep track of error occurrences, trigger a re-assertion of enable signal EN, or take other appropriate action.

Figure 4:
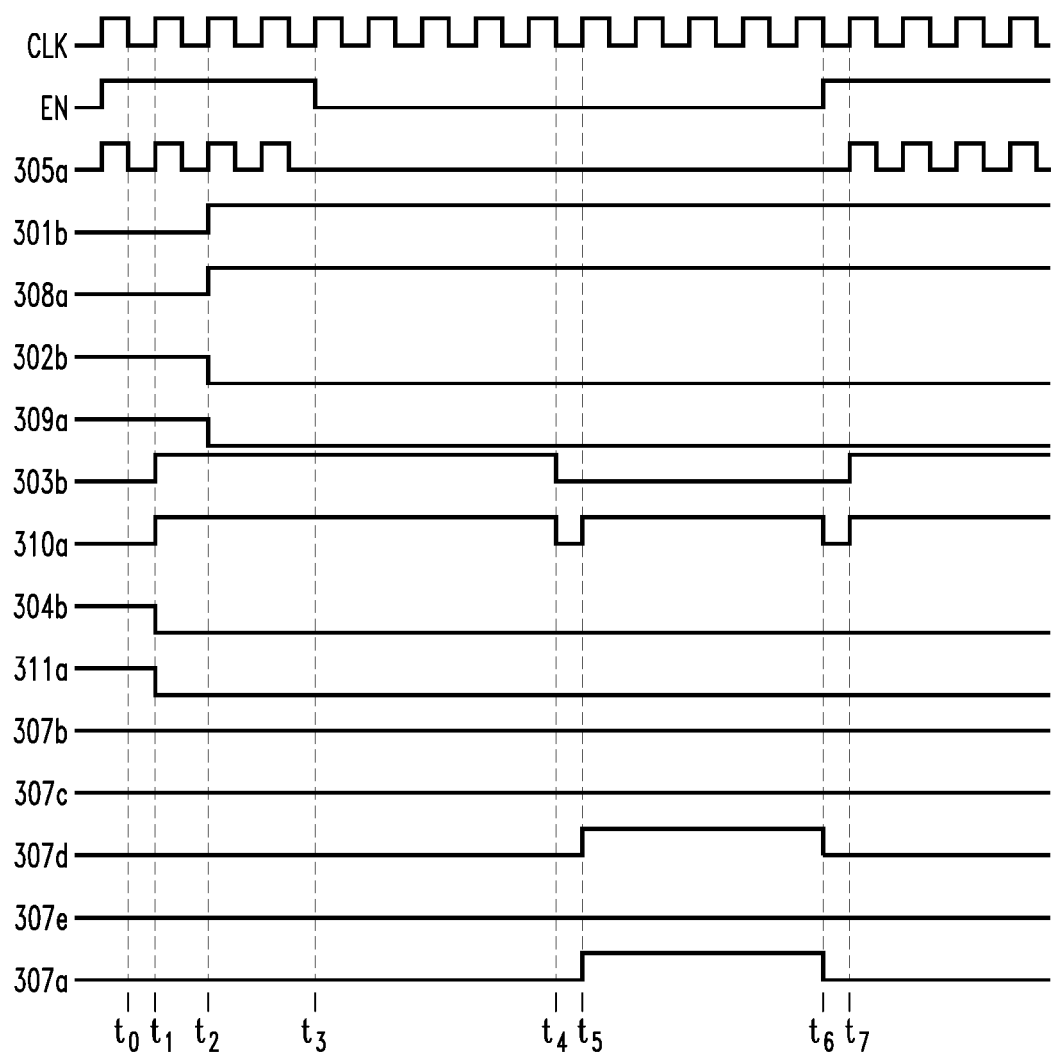
FIG. 4 shows an illustrative timing diagram for certain signals from the circuit of FIG. 3.

FIG. 4 shows an illustrative timing diagram for certain signals from circuit 300 of FIG. 3, where the timing diagram illustrates the example described above, assuming idealized components with minimal lag times. FIG. 4 shows clock signal CLK having a regular period. Enable signal EN starts high at time t0. At time t0, Q output signals 301b and 303b are low, as are the outputs of the corresponding XOR gates, namely signals 308a and 310a, respectively. At time t0, Q output signals 302b and 304b are high, as are the outputs of the corresponding XOR gates, namely signals 309a and 311a, respectively. At time t0, error-correction signals 307b, 307c, 307d, and 307e are low, as is error-detection signal 307a.

At time t1, Q output signal 303b goes from low to high in response to an assertion of input signal 303a (not shown); corresponding XOR gate output signal 310a follows signal 303b. Also at time t1, Q output signal 304b goes from high to low in response to a de-assertion of input signal 304a (not shown); corresponding XOR gate output signal 311a follows signal 304b. At time t2, Q output signal 301b goes from low to high in response to an assertion of input signal 301a (not shown); corresponding XOR gate output signal 308a follows signal 301b. Also at time t2, Q output signal 302b goes from high to low in response to a de-assertion of input signal 302a (not shown); corresponding XOR gate output signal 309a follows signal 302b.

Enable signal EN is de-asserted at time t3. Signal 305a follows clock signal CLK while enable signal EN is high, and stays low after time t3 while enable signal EN is low. Q output signals 301b and 303b are high at time t3, as are the outputs of their corresponding XOR gates, signals 308a and 310a, respectively. Q output signals 302b and 304b are low at time t3, as are the outputs of their corresponding XOR gates, signals 309a and 311a, respectively. Error-correction signals 307b, 307c, 307d, and 307e are low prior to and at time t3. Error-detection signal 307a is also low prior to and at time t3.

At time t4, flip-flop 303 suffers a soft error, represented by Q output signal 303b going low. Corresponding XOR-gate output signal 310a also goes low at time t4. Shortly thereafter, EDC module 307 detects and corrects the error, represented by error-detection signal 307a and error-correction signal 307d going high at time t5, shortly after time t4. Consequently, XOR-gate output signal 310a returns to high at time t5. Thus, the soft error suffered by flip-flop 303 is corrected since signal 310a has been restored to high, as is correct.

At time t6, enable signal EN is re-asserted, and signal 305a begins to follow clock signal CLK, as can be seen at and after time t7. At time t7, flip-flop 303 refreshes its output based on input signal 301a (not shown), which is still high. Consequently, flip-flop 303 returns output 303b back to high. The assertion of enable signal EN indicates a refresh of circuit 300 with correct and/or updated values. Consequently, EDC module 307 automatically de-asserts error-detection signal 307a and error-correction signal 307d, returning signals 307a and 307d to low. Signal 310a goes low briefly between times t6 and t7, but returns to the correct value of high at time t7.

Figure 5:
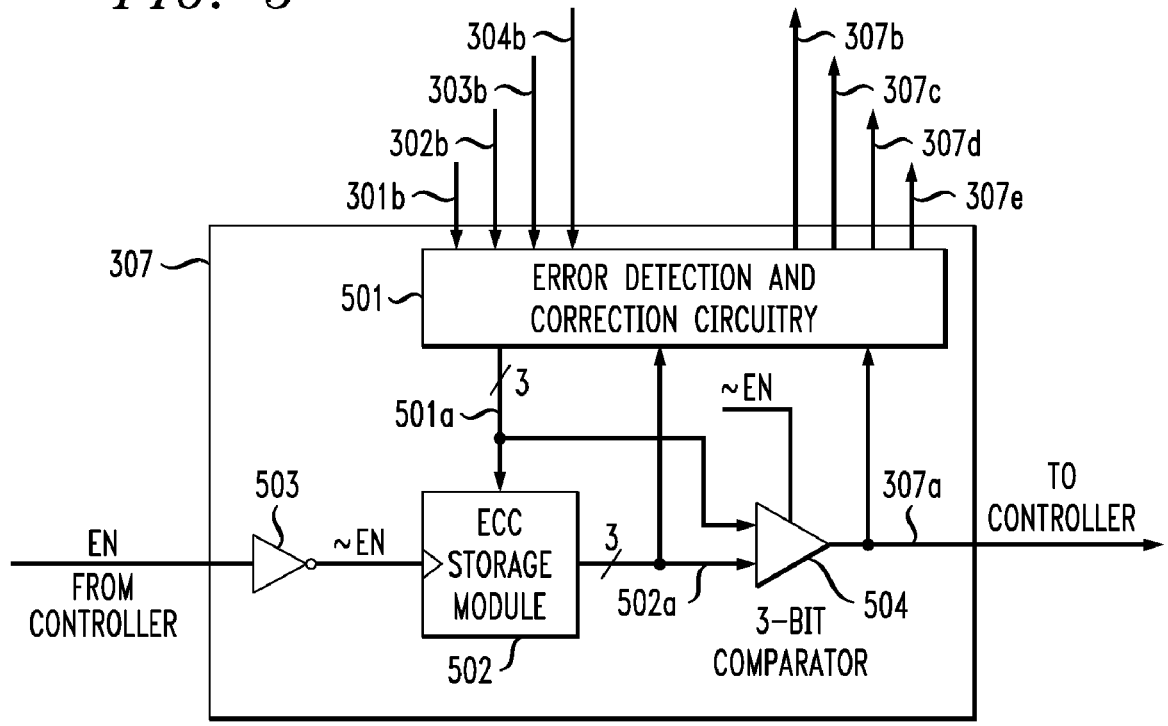
FIG. 5 shows a simplified block diagram of the EDC module of FIG. 3.

FIG. 5 illustrates one possible implementation of EDC module 307 of FIG. 3. EDC module 307 comprises EDC circuitry 501, ECC storage module 502, inverter 503, and 3-bit bit comparator 504. Inverter 503 inverts enable signal EN and outputs not-enable signal ~EN, which is substantially an inverse of enable signal EN. EDC circuitry 501 implements a single-error correct, double-error detect (SEC-DED) algorithm to encode 4 bits of data into a 7-bit Hamming code word comprising the 4 bits of data and a 3-bit ECC code. Any single error in the 4 bits of data can be detected and corrected using the 3-bit ECC code. Two errors in the 4 bits of data can be detected but not corrected with the 3-bit ECC code and the SEC-DED algorithm.

EDC circuitry 501 receives Q output signals 301b, 302b, 303b, and 304b, from which EDC circuitry 501 generates a 3-bit ECC code output to ECC storage module 502 and bit comparator 504 via 3-bit signal 501a. ECC storage module 502 is refreshed on the uptick of not-enable signal ~EN, which indicates that enable signal EN got de-asserted by the controller. While not-enable signal ~EN remains high, ECC storage module 502 maintains the value of the ECC code from the not-enable signal ~EN uptick moment and outputs that uptick ECC code via 3-bit signal 502a to EDC circuitry 501 and bit comparator 504.

Bit comparator 504 (i) provides a low output via error-detection signal 307a when not-enable signal ~EN is low and (ii) compares for equivalency its two 3-bit inputs when not-enable signal ~EN is high. Bit comparator 504 compares the stored 3-bit ECC code on signal 502a to the current 3-bit ECC code provided by EDC circuitry 501 on signal 501a. Bit comparator 504's output is error-detection signal 307a, which is output from EDC module 307 to the controller and is also provided to EDC circuitry 501. If the two 3-bit ECC codes are the same, then error-detection signal 307a is low. If the two 3-bit ECC codes are different, then error-detection signal 307a is high. If error-detection signal 307a is high, then EDC circuitry 501 uses the stored 3-bit ECC code and input signals 301b, 302b, 303b, and 304b to determine, if possible, using the SEC-DED algorithm, which input signal suffered the error. EDC circuitry 501 then inverts the corresponding error-correcting signal, i.e., one of 307b, 307c, 307d, and 307e, respectively.

If a double error occurs, then error-detection signal 307a would go high, but all the error-correcting signals would remain low since EDC circuitry 501 would not be able to determine which two inputs signals were erroneous. The controller can then trigger a re-assertion of enable signal EN to refresh circuit 300. If the controller receives signals indicating whether a single error or a double error occurred, then the controller can limit re-assertion of enable signal EN to situations where a double error occurs (note that the two errors can occur at any time interval). This limitation of the re-assertion of enable signal EN can help reduce power usage by circuit 300.

As noted above, the assertion of error-detection signal 307a can be used by the controller to trigger an assertion of enable signal EN in order to refresh circuit 300, including its flip-flops, and thereby correct the outputs of flip-flops that have suffered soft errors while enable signal EN was low. As also noted, the triggering of the controller's re-assertion of enable signal EN by error-detection signal 307a, in order to refresh circuit 300, can be (i) automatic, where error detection always triggers a refresh or (ii) conditional, where, for example, only the detection of multiple errors triggers a refresh.

Figure 6:
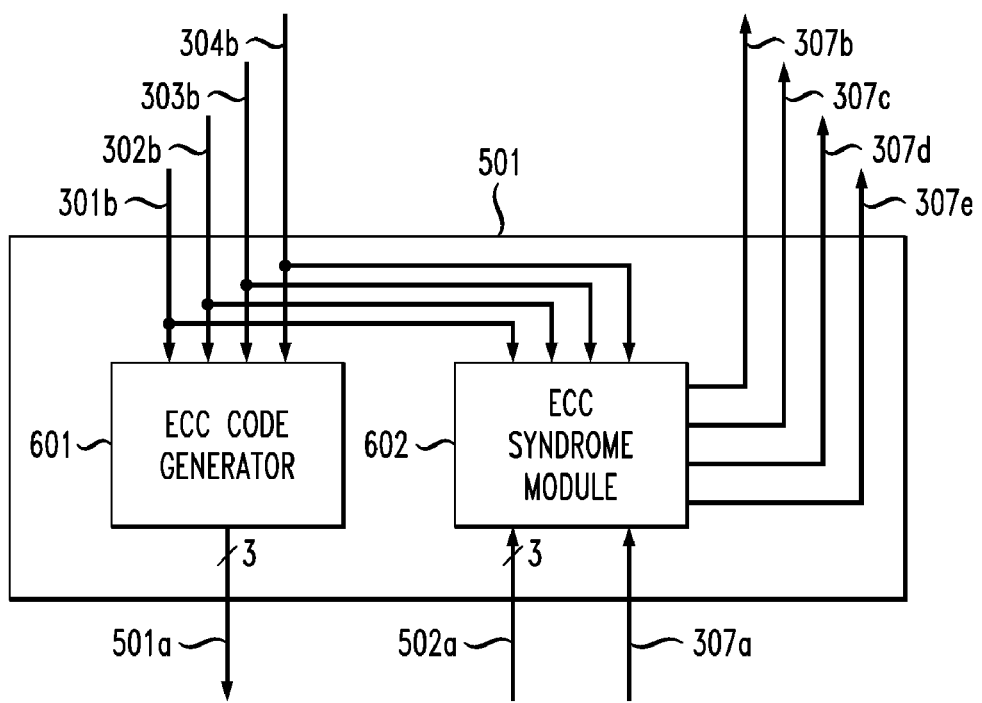
FIG. 6 illustrates one possible implementation of the EDC circuitry of FIG. 5.

FIG. 6 illustrates one possible implementation of EDC circuitry 501 of FIG. 5. EDC circuitry 501 comprises ECC code generator 601 and ECC syndrome module 602. ECC code generator 601 receives Q output signals 301b, 302b, 303b, and 304b as inputs and generates, using a Hamming (7, 4) code, a corresponding 3-bit ECC code that is output via signal 501a. ECC syndrome module 602 receives Q output signals 301b, 302b, 303b, and 304b, 3-bit stored ECC signal 502a, and error-detection signal 307a as inputs. ECC syndrome module outputs error-correction signals 307b, 307c, 307d, and 307e, which are all held low when error-detection signal 307a is low. If it is determined by bit comparator 504 and/or ECC syndrome module 602 that a single error occurred, then ECC syndrome module 602 determines, using the SEC-DED algorithm, which Q output signal suffered the error and flips the corresponding error-correction signal. For example, if it is determined that an error occurred on Q output signal 304b, then error-correction signal 307e is flipped to high so that XOR gate 311 will provide a correct value via signal 311a.

Figure 7:
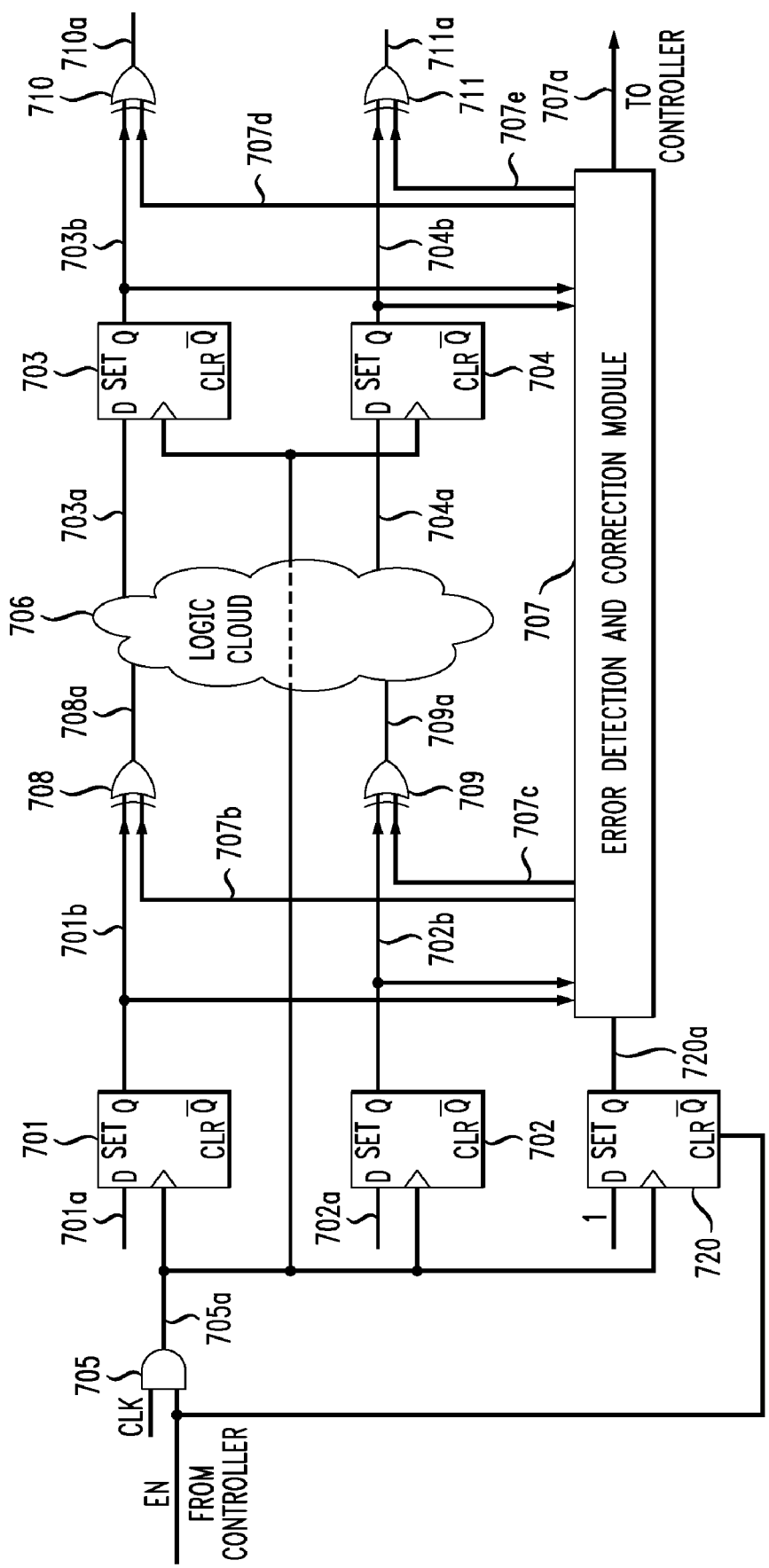
FIG. 7 shows a simplified block diagram of a circuit, in accordance with yet another embodiment of the present invention.

FIG. 7 shows a simplified block diagram of circuit 700. Elements in circuit 700 that are substantially similar to corresponding elements in circuit 300 of FIG. 3 are similarly labeled, but with a different prefix. Circuit 700 further comprises circuitry that allows enable signal EN to enable EDC module 707 asynchronously and disable EDC module 707 synchronously, i.e., circuitry that immediately passes the de-assertion of enable signal EN but that passes the re-assertion of enable signal EN on the next uptick of clock signal CLK.

Specifically, circuit 700 comprises flip-flop 720, which has a high signal, i.e., binary '1,' as its data input, gated clock signal 705a as its trigger (i.e., clock) input, and enable signal EN as its direct clear input. The Q output of flip-flop 720, i.e., latched enable signal 720a, is provided to EDC module 707 instead of enable signal EN. While enable signal EN is high, gated clock signal 705a follows clock signal CLK and latched enable signal 720a is high. When enable signal EN is de-asserted, the direct-clear input of flip-flop 720 is triggered, thereby bringing latched enable signal 720a low. While enable signal EN remains low, gated clock signal 705a also remains low and flip-flop 720 continues outputting a low signal via its Q output. After enable signal EN is re-asserted, gated clock signal 705a again follows clock signal CLK, and on the next positive edge of clock signal CLK, which is also the next positive edge of gated clock signal 705a, latched enable signal 720a goes high. Thus, if enable signal EN transitions from low to high, then latched enable signal 720a subsequently transitions from low to high at a time dependent on clock signal CLK.

It should be noted that, as would be appreciated by one of ordinary skill in the art, many different asynchronous-enable/synchronous-disable circuitries are possible under the scope of the invention. For example, the data input to flip-flop 720 can be enable signal EN rather than a constant high signal. Also, flip-flop 720 could provide its $\overline{Q}$ output, rather than its Q output, to EDC module 707, with corresponding modifications to EDC module 707. It should also be noted that flip-flop 720 may be a hardened flip-flop, may be protected by EDC module 707, and/or may be implemented inside EDC module 707. It should be additionally noted that a synchronous-enable/synchronous-disable circuitry can be used instead of the asynchronous-enable/synchronous-disable circuitry.

Figure 8:
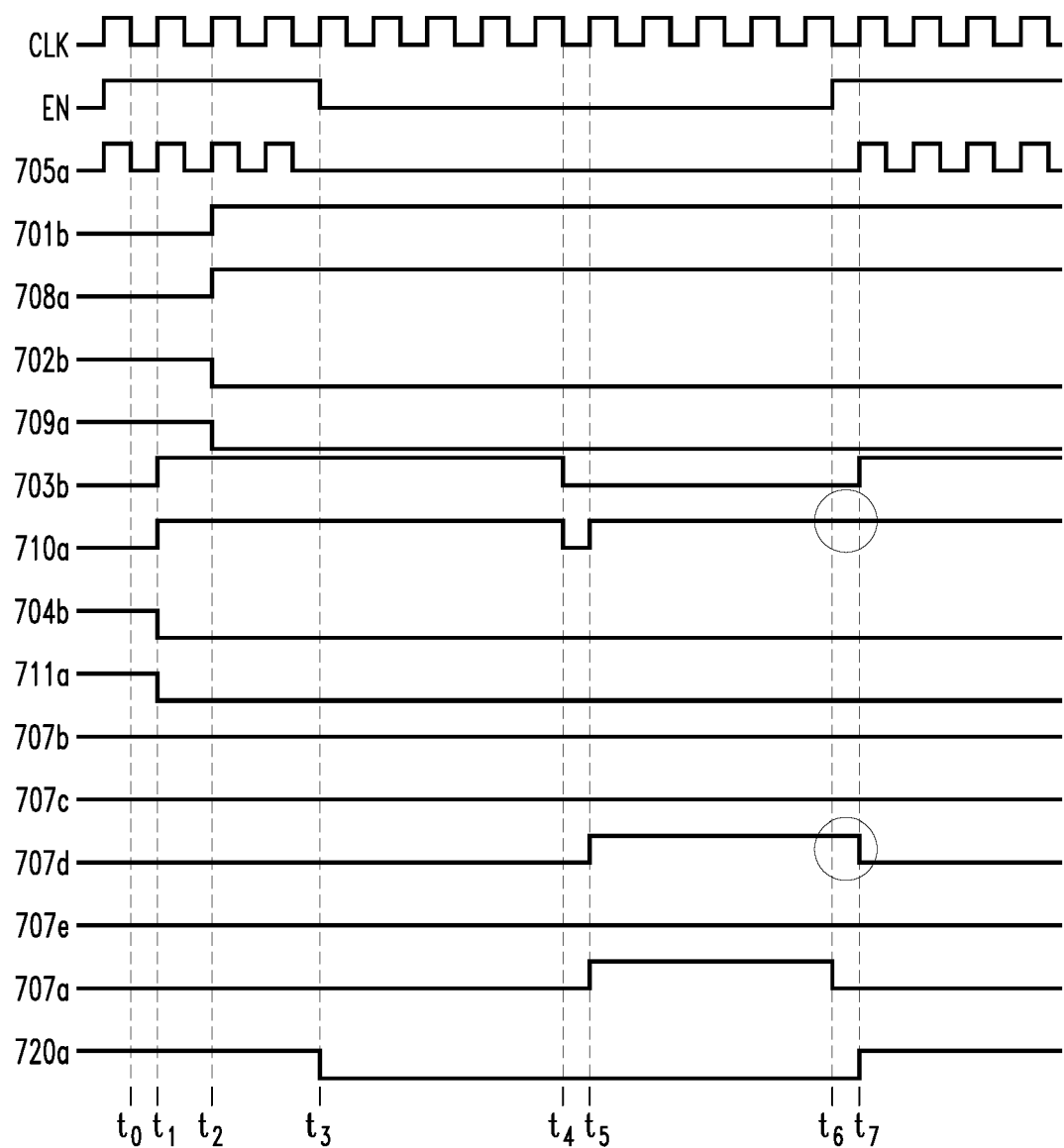
FIG. 8 shows an illustrative timing diagram for certain signals from the circuit of FIG. 7.

FIG. 8 shows an illustrative timing diagram for certain signals from circuit 700 of FIG. 7. The signals shown correspond to the exemplary signals of FIG. 4, with signals that are similarly labeled, but with a different prefix. FIG. 8 further includes latched enable signal 720a. At time t3, when enable signal EN is de-asserted, latched enable signal 720a also goes low. However, when enable signal EN is re-asserted at time t6, latched enable signal 720a does not go high until the next uptick of gated clock signal 705a at time t7. Consequently, error-correction signal 707d goes low at time t7 and output signal 710a remains high, and does not go low, during the interval between time t6 and t7. The intervals where signals 707d and 710a differ from their corresponding signals of FIG. 4, i.e., 307d and 310a, respectively, are marked with circles for ease of identification.

In one alternative embodiment, ECC syndrome module 602 of FIG. 6 does not use error-detection signal 307a and itself determines, using Q output signals 301b, 302b, 303b, and 304b and the stored 3-bit ECC code from signal 502a, whether and where an error occurred on one of the Q output signals. In this embodiment, EDC circuitry 501 would output error-detection 307a, and bit comparator 504 of FIG. 5 would not be necessary. Furthermore, it should be noted that this embodiment does not require the generation of any ECC codes other than the initial ECC code that is stored by ECC storage module 502.

For descriptive simplicity, exemplary implementations have been described wherein the circuits have four flip-flops. Alternative implementations have different numbers of flip-flops, and the corresponding other components have correspondingly different bit-processing sizes. One alternative implementation of circuit 300 of FIG. 3 has 64 flip-flops and 64 corresponding XOR gates, where an ECC code generator of EDC module 307 generates an 8-bit ECC code for storage in an 8-bit ECC storage module, which provides the stored 8-bit ECC code to an ECC syndrome module in EDC module 307 via an 8-bit data line. It should be noted that, generally, as the number of flip-flops increases, the proportional size of a corresponding ECC code shrinks. For example, 4 flip-flops can be protected with a 3-bit ECC code (i.e., 75% ratio), while 32 flip-flops can be protected with a 7-bit ECC code (i.e., 22% ratio), and 64 flip-flops can be protected with an 8-bit ECC code (i.e., 13% ratio). Thus, the benefits of at least some embodiments of the invention increase with increased flip-flop counts.

Exemplary embodiments have been described where error-correction codes based on Hamming codes are used. Alternative embodiments use different algorithms to generate error-correction codes. An exemplary embodiment has been described where a single-bit parity code was used for error-detection. In alternative embodiments, different error-detection algorithms are used. As would be appreciated by one of ordinary skill in the art, many error-detection and error-correction algorithms are possible for use by ED and EDC modules, such as ED module 207 of FIG. 2 and EDC module 307 of FIG. 3.

Exemplary embodiments have been described where the clock inputs of the flip-flops are gated by a gate module controlled by an enable signal. In alternative embodiments, however, no gate modules or enable signals are used. Instead, error detection and/or correction for soft errors occurs continuously while the circuit is powered up.

Embodiments of the invention can be integrated circuits that further comprise flip-flops that are not protected by ED or EDC modules. Embodiments of the invention can be integrated circuits that further comprise flip-flops protected by different instances of ED or EDC modules. Embodiments of the invention can be integrated circuits that further comprise flip-flops protected by other means not described herein.

The present invention has been described in the context of circuits having dependent flip-flops. For example, in circuit 300 of FIG. 3, flip-flop 303 is dependent on one or more of flip-flops 301 and 302, because the data input to flip-flop 303 is based on the data output from either flip-flop 301 or flip-flop 302 or both (as dictated by the processing of logic cloud 306). The present invention is not limited to circuits having dependent flip-flops. In general, the present invention can be implemented in the context of circuits having any suitable combination of dependent and/or independent flip-flops. For example, the present invention could be implemented in the context of a circuit with only two flip-flops analogous to flip-flops 301 and 302, where the input to neither flip-flop is based on the output of the other. Moreover, although the flip-flops in circuit 300 are all driven by the same clock signal CLK, in general, the present invention can be implemented in the context of circuits having flip-flops driven by one or more different clock signals. In some implementations, different clock signals are received by the circuit from a source outside the circuit. In some implementations, different clock signals are generated by the use of intermediary modules such as delay elements, frequency dividers, and/or frequency multipliers within the circuit.

Although particular embodiments and implementations have been described, it should be noted that, as would be appreciated by one of ordinary skill in the art, numerous variations are possible in alternative implementations which do not depart from the scope of the present invention. For example, polarities of signals may be reversed, trigger points may be adjusted, certain intermediary components can be added, components' active periods can be modified, etc., without exceeding the scope of the present invention.

Unless indicated otherwise, the term "determine" and its variants as used herein refer to obtaining a value through measurement and, if necessary, transformation. For example, to determine an electrical-current value, one may measure a voltage across a current-sense resistor, and then multiply the measured voltage by an appropriate value to obtain the electrical-current value. If the voltage passes through a voltage divider or other voltage-modifying components, then appropriate transformations can be made to the measured voltage to account for the voltage modifications of such components and to obtain the corresponding electrical-current value.

As used herein in reference to data transfers between entities in the same device, and unless otherwise specified, the terms "receive" and its variants can refer to receipt of the actual data, or the receipt of one or more pointers to the actual data, wherein the receiving entity can access the actual data using the one or more pointers.

Exemplary embodiments have been described wherein particular entities (a.k.a. modules) perform particular functions. However, the particular functions may be performed by any suitable entity and are not restricted to being performed by the particular entities named in the exemplary embodiments.

Exemplary embodiments have been described with data flows between entities in particular directions. Such data flows do not preclude data flows in the reverse direction on the same path or on alternative paths that have not been shown or described. Paths that have been drawn as bidirectional do not have to be used to pass data in both directions.

Signals and corresponding nodes or ports may be referred to by the same name and are interchangeable for purposes here.

References herein to the verb "to generate" and its variants in reference to information or data do not necessarily require the creation and/or storage of new instances of that information. The generation of information could be accomplished by identifying an accessible location of that information. The generation of information could also be accomplished by having an algorithm for obtaining that information from accessible other information.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

We claim:

1. An integrated circuit comprising:
a first plurality of flip-flops, each flip-flop adapted to:
  receive a corresponding data-input signal and a corresponding clock-input signal;
  provide a corresponding data-output signal; and
  use less energy when the corresponding clock-input signal is constant than when the corresponding clock-input signal is not constant; and
an error-detection module connected to receive the data-output signals of the first plurality of flip-flops, wherein the error-detection module is adapted to:
  generate a first error-detection code based on a first set of values of the received data-output signals of the first plurality of flip-flops; and
  process (i) the first error-detection code and (ii) a second set of values of the received data-output signals of the first plurality of flip-flops to generate an error-detection signal indicating whether or not the error-detection module detected a soft error of a flip-flop in the second set of values of the received data-output signals.

2. The integrated circuit of claim 1, wherein the error-detection module is adapted to generate the error-detection signal by:
  generating a second error-detection code based on the second set of values of the received data-output signals of the first plurality of flip-flops; and
  comparing the first error-detection code to the second error-detection code to generate the error-detection signal.

3. The integrated circuit of claim 2, wherein the error-detection module determines whether the second error-detection code is identical to the first error-detection code.

4. The integrated circuit of claim 2, wherein the integrated circuit further comprises a bit comparator adapted to perform the comparison of the first error-detection code to the second error-detection code and generate the error-detection signal based on the comparison.

5. The integrated circuit of claim 1, wherein the integrated circuit further comprises a first gate module adapted to:
  receive a clock signal and an enable signal;
  generate an output signal that (1) follows the received clock signal, when the received enable signal has a first value, and (2) remains at a second value when the received enable signal has a third value different from the first value; and
  provide the output signal to one or more flip-flops of the first plurality of flip-flops, wherein the output signal corresponds to the clock-input signals of the one or more flip-flops of the first plurality of flip-flops.

6. The integrated circuit of claim 5, wherein the first gate module's output signal corresponds to the clock-input signal of all of the flip-flops of the first plurality of flip-flops.

7. The integrated circuit of claim 5, wherein the error-detection module is adapted to store the first error-detection code in response to the enable signal transitioning from the first value to the third value.

8. The integrated circuit of claim 7, wherein, while the received enable signal has the third value, the error-detection module is adapted to update the error detection signal based on (i) the first error-detection code and (ii) an updated second set of values of the received data-output signals of the first plurality of flip-flops.

9. The integrated circuit of claim 5, further comprising synchronous-disable circuitry connected to provide to the error-detection module a latched enable signal that is based on the enable signal and the clock signal, such that:
  if the enable signal transitions from a fourth value to a fifth value, then the latched enable signal consequently transitions from a corresponding sixth value to a corresponding seventh value; and if the enable signal transitions from the fifth value to the fourth value, then the latched enable signal subsequently transitions from the corresponding seventh value to the corresponding sixth value at a time dependent on the clock signal.

10. The integrated circuit of claim 1, wherein the first plurality of flip-flops comprises a first flip-flop and a second flip-flop, wherein the data input signal of the first flip-flop is independent of the data input signal of the second flip-flop.

11. The integrated circuit of claim 1, wherein the integrated circuit further comprises a controller adapted to receive the error-detection signal and perform a corrective action in response to the error-detection signal indicating that the error-detection module detected the soft error of the flip-flop in the second set of values of the received data-output signals.

12. The integrated circuit of claim 1, wherein the controller is adapted to perform the corrective action by refreshing the first plurality of flip-flops.

13. The integrated circuit of claim 1, wherein:
the error-detection module is an error detection and correction module;
the first error-detection code is an error-correction code; and
the error detection and correction module is further adapted to generate a plurality of error-correction signals whose values are based on the first error-detection code and the second set of values of the received data-output signals of the first plurality of flip-flops, wherein the plurality of error-correction signals are used to compensate for the soft error of the flip-flop.

14. The integrated circuit of claim 13, wherein:
each error-correction signal corresponds to a different flip-flop of the first plurality of flip-flops;
the integrated circuit further comprises an error-correcting gate module for each flip-flop of the first plurality of flip-flops;
each error-correcting gate module is connected to receive (i) the data-output signal of the corresponding flip-flop and (ii) the corresponding error-correction signal; and
each error-correcting gate module is adapted to output (i) the data-output signal of the corresponding flip-flop when the corresponding error-correction signal indicates that the error detection and correction module did not detect a soft error of the corresponding flip-flop and (ii) the inverse of the data-output signal of the corresponding flip-flop when the corresponding error-correction signal indicates that the error detection and correction module detected a soft error of the corresponding flip-flop.

15. The integrated circuit of claim 1, wherein:
(a) the error-detection module is adapted to generate the error-detection signal by:
(1) generating a second error-detection code based on the second set of values of the received data-output signals of the first plurality of flip-flops; and
(2) comparing the first error-detection code to the second error-detection code to generate the error-detection signal;
(b) the integrated circuit further comprises:
(1) a first gate module adapted to:
receive a clock signal and an enable signal;
generate an output signal that (1) follows the received clock signal, when the received enable signal has a first value, and (2) remains at a second value when the received enable signal has a third value different from the first value; and
provide the output signal to one or more flip-flops of the first plurality of flip-flops, wherein the output signal corresponds to the clock-input signals of the one or more flip-flops of the first plurality of flip-flops;
(2) a bit comparator adapted to perform the comparison of the first error-detection code to the second error-detection code, when the enable signal has the third value, and generate the error-detection signal based on the comparison; and
(3) a controller adapted to receive the error-detection signal and perform a corrective action in response to the error-detection signal indicating that the error-detection module detected the soft error of the flip-flop in the second set of values of the received data-output signals;
(c) the first gate module's output signal corresponds to the clock-input signal of all of the flip-flops of the first plurality of flip-flops; and
(d) the error-detection module is adapted to store the first error-detection code in response to the enable signal transitioning from the first value to the third value.

16. The integrated circuit of claim 15, wherein:
the error-detection module is an error detection and correction module;
the first error-detection code is a Hamming code based on the first set of values of the received data-output signals of the first plurality of flip-flops;
the error detection and correction module is further adapted to generate a plurality of error-correction signals whose values are based on the first error-detection code and the second set of values of the received data-output signals of the first plurality of flip-flops, wherein the plurality of error-correction signals are used to compensate for the soft error of the flip-flop;
each error-correction signal corresponds to a different flip-flop of the first plurality of flip-flops;
the integrated circuit further comprises an error-correcting gate module for each flip-flop of the first plurality of flip-flops;
each error-correcting gate module is connected to receive (i) the data-output signal of the corresponding flip-flop and (ii) the corresponding error-correction signal; and
each error-correcting gate module is adapted to output (i) the data-output signal of the corresponding flip-flop when the corresponding error-correction signal indicates that the error detection and correction module did not detect a soft error of the corresponding flip-flop and (ii) the inverse of the data-output signal of the corresponding flip-flop when the corresponding error-correction signal indicates that the error detection and correction module detected a soft error of the corresponding flip-flop.

17. A method for detecting a soft error of a flip-flop in a first plurality of flip-flops in an integrated circuit, the method comprising:
receiving, by each flip-flop of the first plurality of flip-flops, a corresponding data-input signal and a corresponding clock-input signal, wherein the flip-flop uses less energy when the corresponding clock-input signal is constant than when the corresponding clock-input signal is not constant;
providing, by each flip-flop of the first plurality of flip-flops, a corresponding data-output signal;
generating a first error-detection code based on a first set of values of the data-output signals of the first plurality of flip-flops; and processing (i) the first error-detection code and (ii) a second set of values of the data-output signals of the first plurality of flip-flops to generate an error-detection signal indicating whether or not the soft error of the flip-flop was detected in the second set of values of the received data-output signals.

18. The method of claim 17, wherein generating the error-detection signal comprises:
generating a second error-detection code based on the second set of values of the received data-output signals of the first plurality of flip-flops; and
comparing the first error-detection code to the second error-detection code to generate the error-detection signal.

19. The method of claim 17, further comprising:
generating a gate-module output signal that (1) follows a received clock signal, when a received enable signal has a first value, and (2) remains at a second value when the received enable signal has a third value different from the first value;
providing the gate-module output signal to one or more flip-flops of the first plurality of flip-flops, wherein the gate-module output signal corresponds to the clock-input signals of the one or more flip-flops of the first plurality of flip-flops;
storing the first error-detection code in response to the received enable signal transitioning from the first value to the third value; and
performing a corrective action in response to the error-detection signal indicating that the soft error of the flip-flop was detected in the second set of values of the received data-output signals.

20. The method of claim 17, further comprising:
generating a plurality of error-correction signals, each corresponding to a different flip-flop of the first plurality of flip-flops, whose values are based on the first error-detection code and the second set of values of the received data-output signals of the first plurality of flip-flops;
using the plurality of error-correction signals to compensate for the soft error of the flip-flop;
outputting (i) the data-output signal of the corresponding flip-flop when the corresponding error-correction signal indicates that the error detection and correction module did not detect a soft error of the corresponding flip-flop and (ii) the inverse of the data-output signal of the corresponding flip-flop when the corresponding error-correction signal indicates that the error detection and correction module detected a soft error of the corresponding flip-flop.

21. The integrated circuit of claim 1, wherein:
the first set of values of the received data-output signals of the first plurality of flip-flops represents the outputs of the flip-flops at a first time;
the second set of values of the received data-output signals of the first plurality of flip-flops represents the outputs of the flip-flops at a second time that is later than the first time; and
the soft error, if any is detected, occurred between the first time and the second time.

* * * * *